United States Patent  
Hsiao et al.

(10) Patent No.: US 11,172,566 B2  
(45) Date of Patent: Nov. 9, 2021

(54) DROPLET GENERATOR, EUV LITHOGRAPHY DEVICE AND METHOD OF GENERATING A SERIES OF DROPLETS USING A DROPLET GENERATOR

(71) Applicant: Taiwan Semiconductor Manufacturing Co., Ltd., Hsinchu (TW)

(72) Inventors: Jen-Hung Hsiao, Hsinchu (TW); Po-Chung Cheng, Chiayi County (TW); Li-Jui Chen, Hsinchu (TW); Shang-Chieh Chien, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 25 days.

(21) Appl. No.: 16/805,854

(22) Filed: Mar. 2, 2020

(65) Prior Publication Data

US 2021/0037634 A1 Feb. 4, 2021

Related U.S. Application Data

(60) Provisional application No. 62/880,655, filed on Jul. 31, 2019.

(51) Int. Cl.  
*H05G 2/00* (2006.01)  
*G03F 7/20* (2006.01)

(52) U.S. Cl.  
CPC ......... *H05G 2/006* (2013.01); *G03F 7/70033* (2013.01); *H05G 2/008* (2013.01)

(58) Field of Classification Search  
None  
See application file for complete search history.

(56) References Cited

U.S. PATENT DOCUMENTS

| | | | |
|---|---|---|---|
| 8,764,995 B2 | 7/2014 | Chang et al. | |
| 8,796,666 B1 | 8/2014 | Huang et al. | |
| 8,828,625 B2 | 9/2014 | Lu et al. | |
| 8,841,047 B2 | 9/2014 | Yu et al. | |
| 8,877,409 B2 | 11/2014 | Hsu et al. | |
| 9,093,530 B2 | 7/2015 | Huang et al. | |
| 9,184,054 B1 | 11/2015 | Huang et al. | |
| 9,256,123 B2 | 2/2016 | Shih et al. | |
| 9,529,268 B2 | 12/2016 | Chang et al. | |
| 9,548,303 B2 | 1/2017 | Lee et al. | |
| 2016/0128170 A1* | 5/2016 | Rajyaguru | H05G 2/006 250/504 R |
| 2017/0053780 A1* | 2/2017 | Iwamoto | H05G 2/005 |
| 2018/0288863 A1* | 10/2018 | Fujimaki | H05G 2/006 |

* cited by examiner

*Primary Examiner* — Michelle M Iacoletti  
(74) *Attorney, Agent, or Firm* — JCIPRNET

(57) ABSTRACT

A droplet generator includes a steering system, a reservoir, a nozzle, a first heater, a second heater and a third heater. The steering system is used for controlling a position of droplet release of the droplet generator. The reservoir is held on the steering system for storing tin. The nozzle is connected with the reservoir for generating tin droplets, wherein the nozzle comprises at least a first zone, a second zone and a third zone connected in sequence. The first heater surrounds a peripheral surface of the nozzle in the first zone. The second heater surrounds a peripheral surface of the nozzle in the second zone. The third heater surrounds a peripheral surface of the nozzle in the third zone, wherein the heating of the first heater, the second heater and the third heater are separately controlled.

20 Claims, 12 Drawing Sheets

DROPLET GENERATOR, EUV LITHOGRAPHY DEVICE AND METHOD OF GENERATING A SERIES OF DROPLETS USING A DROPLET GENERATOR

CROSS-REFERENCE TO RELATED APPLICATION

This application claims the priority benefit of U.S. provisional application Ser. No. 62/880,655, filed on Jul. 31, 2019. The entirety of the above-mentioned patent application is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. The decrease in size of devices has been met with advancements in semiconductor manufacturing techniques such as lithography.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1:
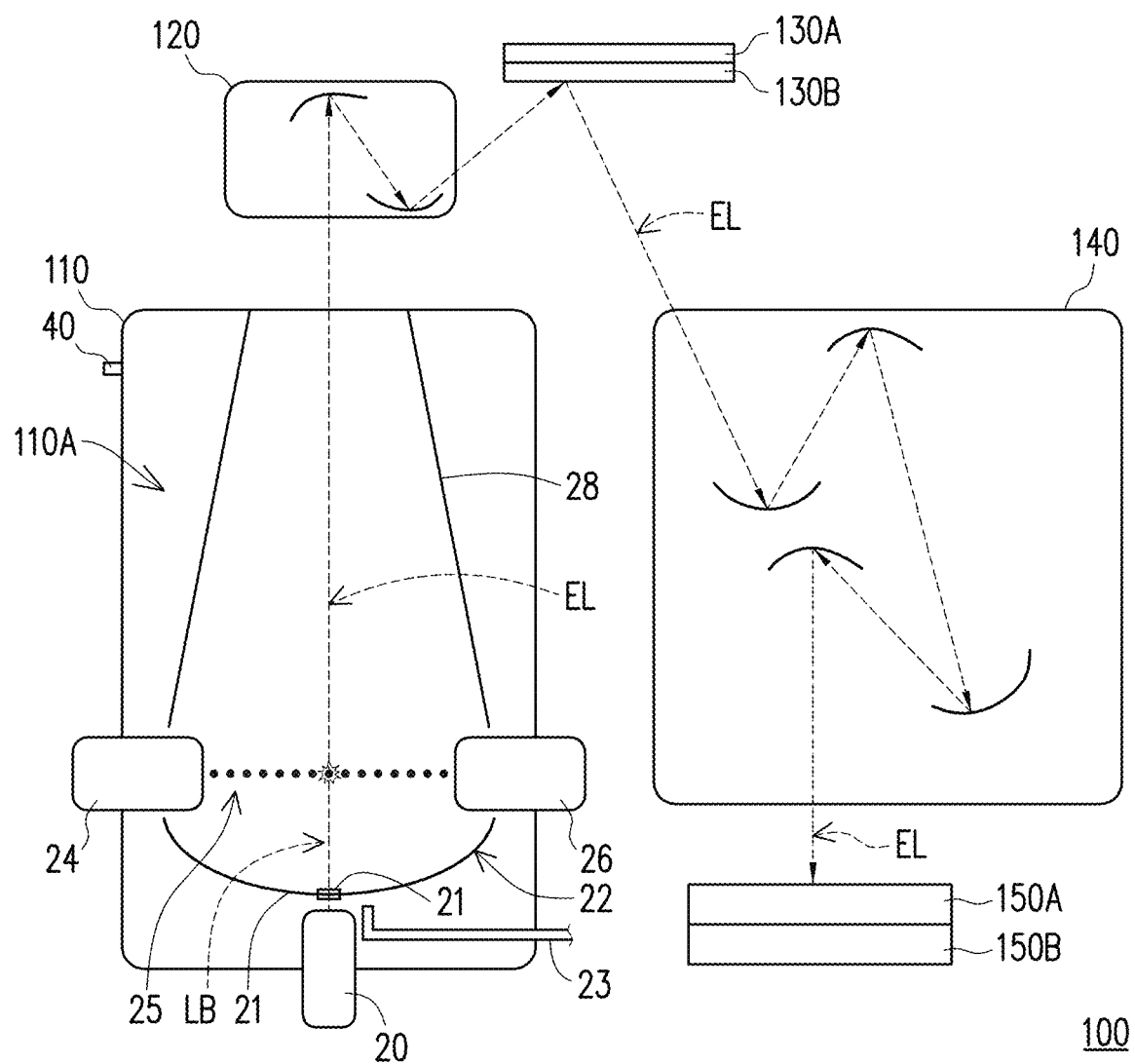
FIG. 1 illustrates an extreme ultraviolet (EUV) lithography device according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

FIG. 1 illustrates an extreme ultraviolet (EUV) lithography device according to some exemplary embodiments of the present disclosure. Referring to FIG. 1, an extreme ultraviolet (EUV) lithography device 100 is provided. The extreme ultraviolet (EUV) lithography device 100 may also be generically referred to as a scanner that is operable to perform lithography exposing processes with respective radiation source and exposure mode. In some embodiments, the EUV lithography device 100 is a device designed to expose a resist layer by EUV light. In certain embodiments, the resist layer is a suitable material sensitive to the EUV light.

In the exemplary embodiment, the EUV lithography device 100 includes a radiation source 110 (or light source) that is used to generate radiation light (or EUV light). For example, EUV light having a wavelength in a range between about 1 nm to about 100 nm is generated. In some embodiments, the radiation source 110 employs a laser produced plasma (LPP) mechanism to generate plasma and further generate EUV light from the plasma. In some embodiments, the radiation source 110 includes a laser generator 20 (e.g., such as a $CO_2$ laser) that generates a laser beam LB. The laser generator 20 may be a pulse carbon dioxide ($CO_2$) laser generator/gas discharge $CO_2$ laser generator (e.g., producing radiation at about 10.6 μm) that generates the laser beam LB. However, the disclosure is not limited thereto. In other embodiments, other types of lasers may be suitably used. For example, a neodymium-doped yttrium aluminum garnet (Nd:YAG) laser may be used.

As illustrated in FIG. 1, the laser beam LB may be directed through an output window 21 integrated with a collector 22 (generally referred as LPP collector or EUV collector). In some embodiments, the output window 21 adopts a suitable material substantially transparent to the laser beam LB. In some embodiments, the collector 22 is designed with proper coating materials and shape, functioning as a mirror for EUV collection, reflection and focus. In certain embodiments, the collector 22 is designed to have an ellipsoidal geometry. Furthermore, a coating material of the collector 22 includes a reflective multilayer such as a plurality of Mo/Si film pairs, and may further include a capping layer (such as Ru) coated on the reflective multilayer to substantially reflect the EUV light. In some embodiments, the collector 22 may further include a grating structure designed to effectively scatter the laser beam LB directed onto the collector 22. For example, a silicon nitride layer is coated on the collector 22 and is patterned to have a grating pattern.

In some embodiments, a buffer gas may be supplied from a gas supply 23 to the output window 21 of the collector 22. For example, the buffer gas may be $H_2$, He, Ar, N or another inert gas. In certain embodiments, $H_2$ is used as H radicals generated by ionization of the buffer gas can be used for cleaning purposes. In certain embodiments, one or more gas outlets 40 may be provided in the radiation source 110 so that the buffer gas may be exhausted to the outside.

In some embodiments, the laser beam LB is directed to heat a target material 25, thereby generating high-temperature plasma, which further produces EUV radiation or EUV light EL (radiation light). In the exemplary embodiment, the target material 25 is tin (Sn). The target material 25 is delivered in form of droplets, and may be referred as tin (Sn) droplets or simply droplets. The EUV light EL is collected by the collector 22, wherein the collector 22 may further reflect and focus the EUV light EL for the lithography exposing processes.

As shown in FIG. 1, the radiation source 110 is configured in an enclosed space (referred to as a vessel chamber 110A). The vessel chamber 110A is maintained in a vacuum environment since the air absorbs the EUV radiation. Furthermore, the vessel chamber 110A is where the target material 25 (tin droplets) are processed into plasma, and further produces the EUV light EL (radiation light). In some embodiments, a plasma monitoring module (not shown) is embedded in the radiation source 110 and is configured to monitor the plasma condition of the radiation source 110. Furthermore, the radiation source 110 may further include a droplet generator 24 for generating the target material 25 (e.g. tin droplets), and a catcher tank 26 that is configured to collect or catch the target material 25 (e.g. tin droplets). In some embodiments, the catcher tank 26 is installed opposite to the droplet generator 24 for catching excessive target material 25. For example, some of the target material 25 may be missed by the laser beam LB and reaches the catcher tank 26.

In some embodiments, pulses of the laser generator 20 and the droplet generating rate of the droplet generator 24 are controlled to be synchronized such that the target material 25 (tin droplets) receive peak powers consistently from the laser pulses of the laser generator 20. In some embodiments, the target material (tin droplets) generation frequency ranges from 20 kHz to 100 kHz. For example, the laser generator 20 may include a laser circuit designed to control the generation of the laser pulses. The laser circuit and the droplet generator 24 are coupled to synchronize the generation of the laser pulses and the generations of the target material 25. In one exemplary embodiment, when tin droplets are employed as the target material 25, the tin droplets may each have a diameter about 30 microns (μm). For example, tin droplets are generated at a rate about 50 droplets per second and are introduced into a zone of excitation at a speed about 70 meters per second (m/s). The disclosure is not limited thereto.

In some embodiments, the radiation source 110 may further include a debris collection structure 28 having a plurality of vanes (not shown). In some embodiments, the debris collection structure is used to trap stannane ($SnH_4$), or other debris that are generated as a byproduct during the EUV generation process. In certain embodiments, the debris collection structure 28 serves to prevent the surface of the collector 22 and/or other elements/components inside the vessel chamber 110A from being coated with tin vapor by sweeping out slow Sn atoms and/or stannane ($SnH_4$) via the rotating vanes.

Referring to FIG. 1, the EUV lithography device 100 further includes an illuminator 120. In some embodiments, the illuminator 120 includes various refractive optic components, such as a single lens or a lens system having multiple lenses (zone plates) or alternatively reflective optics (for EUV lithography device), such as a single mirror or a mirror system having multiple mirrors in order to direct light (EUV light EL/radiation light) from the radiation source 110 onto a reticle stage 130A (or mask stage). In some embodiments, the reticle stage 130A is used to secure a mask 130B. For example, the reticle stage 130A may include an electrostatic chuck (e-chuck) to secure the mask. In the present disclosure, the terms of mask, photomask, and reticle are used interchangeably.

In the exemplary embodiment, the mask 130B is for example, a reflective mask. An exemplary structure of the mask 130B may include a substrate with a low thermal expansion material (LTEM). In some embodiments, the low thermal expansion material may include $TiO_2$ doped $SiO_2$, or other suitable materials with low thermal expansion. In certain embodiments, the mask 130B may include a reflective multi-layer deposited on the substrate. The reflective multi-layer includes a plurality of film pairs, such as molybdenum-silicon (Mo/Si) film pairs (e.g., a layer of molybdenum above or below a layer of silicon in each film pair). Alternatively, the reflective multi-layer may include molybdenum-beryllium (Mo/Be) film pairs, or other suitable materials that are configurable to highly reflect the EUV light EL. In some embodiments, the mask 130B may further include a capping layer, such as ruthenium (Ru), disposed on the reflective multi-layer for protection. In some embodiments, the mask 130B further includes an absorption layer, such as a tantalum boron nitride (TaBN) layer, deposited over the reflective multi-layer. The absorption layer is patterned to define a layer of an integrated circuit (IC). Alternatively, another reflective layer may be deposited over the reflective multi-layer and is patterned to define a layer of an integrated circuit, thereby forming an EUV phase shift mask. However, the disclosure is not limited thereto, and the mask 130B may have various other structures or configuration in different embodiments.

Referring to FIG. 1, the EUV lithography device 100 may further include a projection module (or projection optics box (POB)) 140 for imaging the pattern of the mask 130B onto a semiconductor wafer 150A (or semiconductor substrate) secured on a wafer stage (or substrate stage) 150B of the EUV lithography device 100. In some embodiments, the projection module 140 includes reflective optics for projecting the EUV light EL. In the exemplary embodiment, the EUV light EL directed from the mask 130B, carrying the image of the pattern defined on the mask 130B, is collected by the projection module 140. In some embodiments, the illuminator 120 and the projection module 140 may be collectively referred to as an optical module of the EUV lithography device 100. Furthermore, in some embodiments, the semiconductor wafer 150A is a semiconductor wafer, such as a silicon wafer or other type of wafer to be patterned. The semiconductor wafer 150A may be coated with a resist layer sensitive to the EUV light EL. The EUV lithography device 100 may further include other modules or be integrated with (or be coupled with) other modules, the disclosure is not limited thereto.

Figure 2:
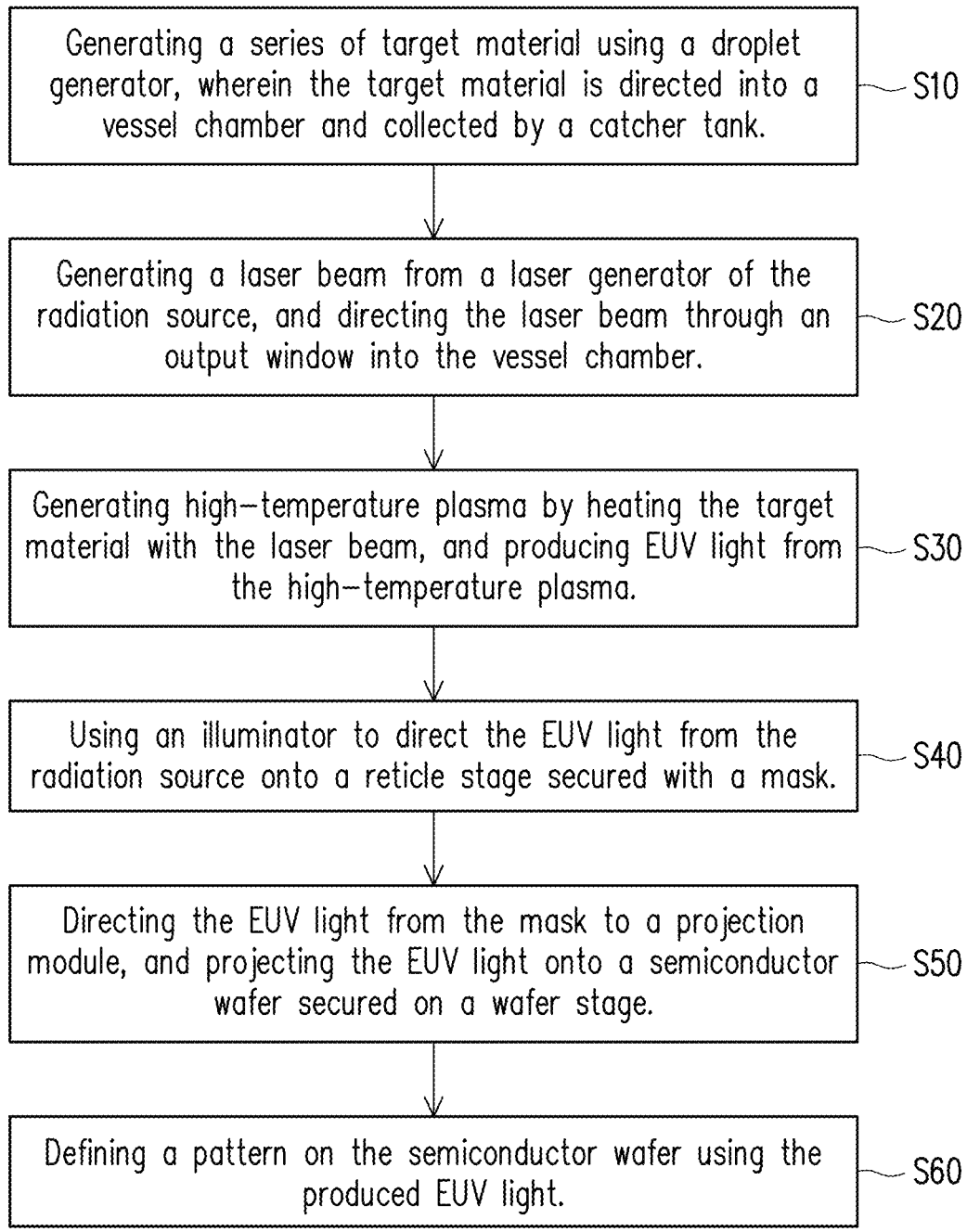
FIG. 2 is a flow chart of a method for using an EUV lithography device according to some exemplary embodiments of the present disclosure.

FIG. 2 is a flow chart of a method for using an EUV lithography device according to some exemplary embodiments of the present disclosure. In some embodiments, a method of using the EUV lithography device 100 of FIG. 1 will be explained with reference to FIG. 2.

Referring to step S10 shown in FIG. 2 and as illustrated in FIG. 1, a series of target material 25 is generated using a droplet generator 24, wherein the target material 25 is directed into a vessel chamber 110A of the radiation source 110 and collected by a catcher tank 26 located in the vessel chamber 110A. For example, the target material 25 may be tin droplets. Referring to step S20 shown in FIG. 2 and as illustrated in FIG. 1, a laser beam LB is generated from a laser generator 20, and the laser beam LB is directed to the vessel chamber 110A through an output window 21 integrated with a collector 22. In some embodiments, referring to step S30, after generating the laser beam LB, the laser beam LB is directed to heat the target material 25 in the vessel chamber 110A, thereby generating high-temperature plasma, which further produces EUV radiation or EUV light EL.

Referring to step S40 shown in FIG. 2 and as illustrated in FIG. 1, after producing EUV light EL, an illuminator 120 is used to direct the EUV light EL from the radiation source 110 onto a reticle stage 130A secured with a mask 130B. For example, the mask 130B may be a reflective mask. Thereafter, referring to step S50, the EUV light EL is directed from the mask 130B to a projection module 140, and the EUV light EL may be projected onto a semiconductor wafer 150A secured on a wafer stage 150B. In some embodiments, the projection module 140 is used for imaging the pattern of the mask 130B onto the semiconductor wafer 150A. Referring to step S60, in certain embodiments, after projecting the EUV light EL onto the semiconductor wafer 150A, a pattern may be defined on the semiconductor wafer 150A using the produced EUV light EL.

Figure 3:
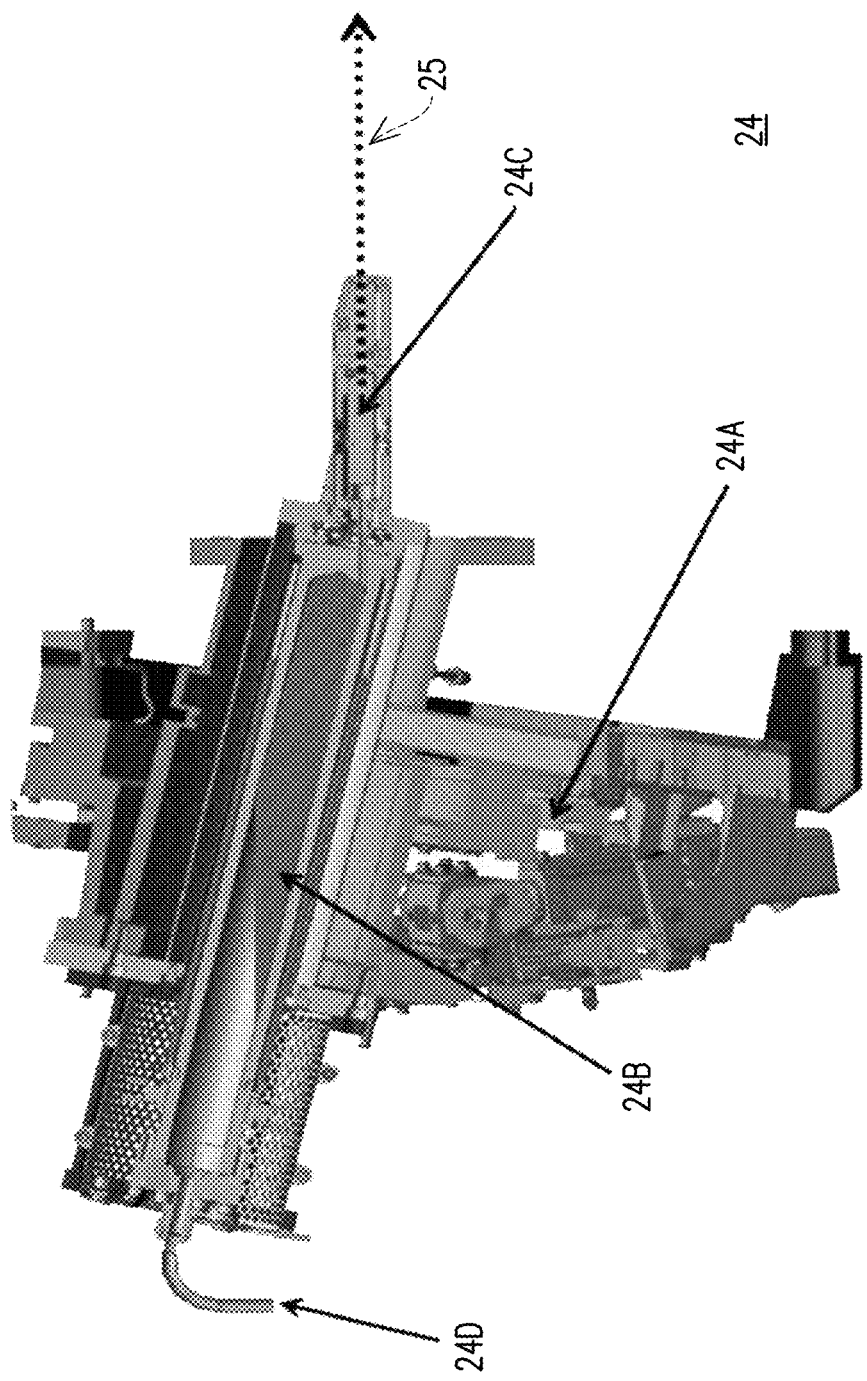
FIG. 3 illustrates a schematic diagram of a droplet generator according to some exemplary embodiments of the present disclosure.

FIG. 3 illustrates a schematic diagram of a droplet generator according to some exemplary embodiments of the present disclosure. As illustrated in FIG. 3, in some embodiments, the droplet generator 24 includes a steering system 24A, a reservoir 24B, a nozzle 24C and a gas supply unit 24D. In the exemplary embodiment, the steering system 24A is used for controlling a position of droplet (target material 25) release of the droplet generator 24. For example, the steering system 24A steers a flow of tin droplets (target material 25) generated by the droplet generator 24 to orient the tin droplets (target material 25) to a target place, so that the target material 25 (tin droplets) are processed into plasma, and further produces the EUV light EL.

Furthermore, as illustrated in FIG. 3, the reservoir 24B is held on the steering system 24A. In other words, the movement and positions of the reservoir 24B (and the nozzle 24C attached thereto) are controlled by the steering system 24A. In some embodiments, the reservoir 24B is used for storing a precursor material of the target material 25. For example, if the target material 25 are tin droplets, then the reservoir may be used for storing solid tin, which may be further processed into liquid tin during operation of the EUV lithography device 100.

In some embodiments, the nozzle 24C may be attached to one end of the reservoir 24B, while the gas supply unit 24D (such as a gas supply tube) is attached to another end of the reservoir 24B. In certain embodiments, the nozzle 24C and the gas supply unit 24D are attached or connected to two opposing ends of the reservoir 24B. In one embodiment, during the operation of the EUV lithography device 100, the solid tin packed in the reservoir 24B is heated up to form liquid tin (molten tin), and inert gas is supplied from the gas supply unit 24D from a back end of the reservoir 24B to pressurize and transfer the liquid tin from the reservoir 24B to the nozzle 24C. In some embodiments, the pressurized tin fluid flows through the nozzle 24C establishing a continuous stream, which subsequently breaks into a plurality of droplets (target material 25) exiting the nozzle 24C. In one embodiment, the reservoir 24B is supplied with an inert gas such as argon at a pressure of approximately 4000 psi to pressurize and transfer the liquid tin (precursor material) from the reservoir 24B to the nozzle 24C. The different embodiments of the nozzle 24C will be explained in detail with reference to FIG. 4 to FIG. 6.

Figure 4:
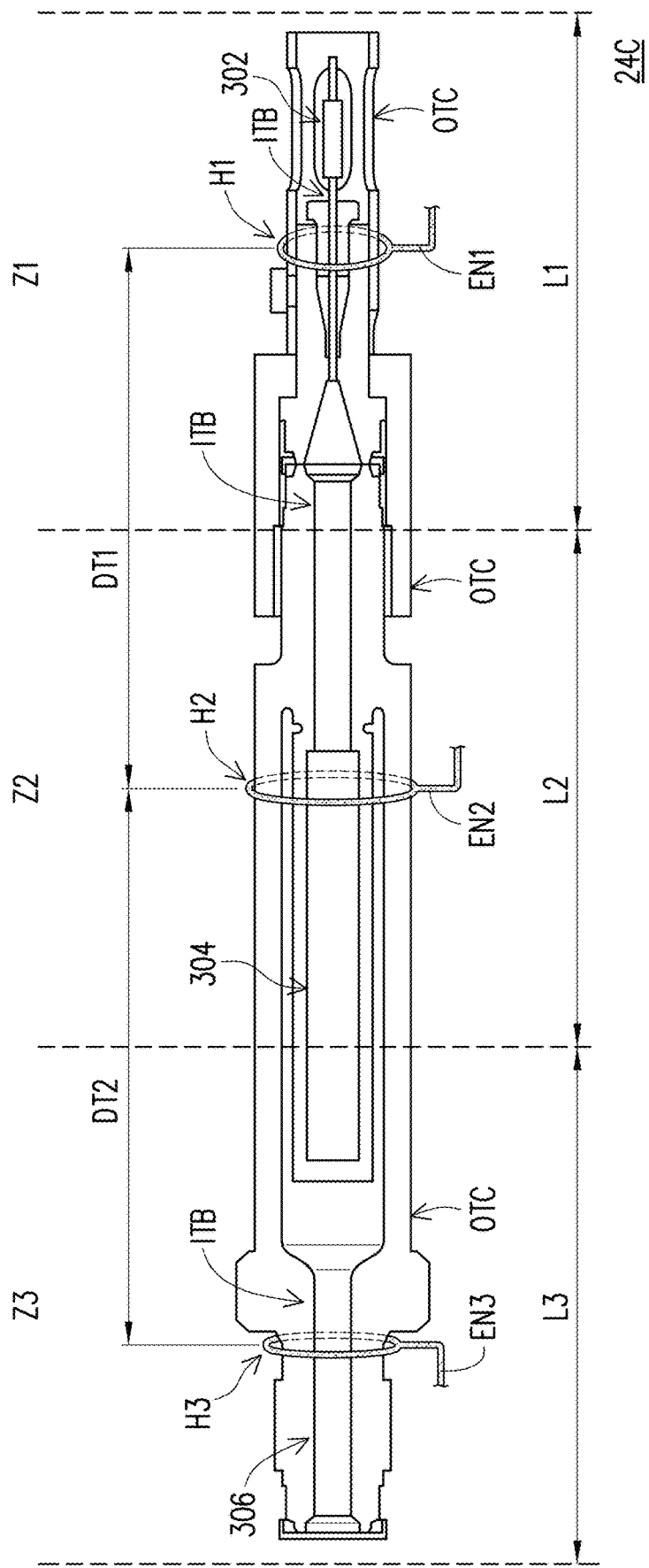
FIG. 4 illustrates a schematic diagram of a nozzle according to some exemplary embodiments of the present disclosure.

FIG. 4 illustrates a schematic diagram of a nozzle according to some exemplary embodiments of the present disclosure. As illustrated in FIG. 4, in some embodiments, the nozzle 24C may include at least a first zone Z1, a second zone Z2 and a third zone Z3 connected in sequence. In the exemplary embodiment, a ratio of a length L1 of the first zone Z1, a length L2 of the second zone Z2, and a length L3 of the third zone Z3 is 1:1:1. However, the disclosure is not limited thereto, and the lengths of the first zone Z1, the second zone Z2 and the third zone Z3 may be adjusted according to requirement. In some embodiments, the nozzle 24C includes an inner tube ITB where the precursor material (such as liquid tin) is transferred and processed into the target material 25 (such as tin droplets), and an outer tube OTC where the inner tube ITB is situated therein.

Furthermore, in the exemplary embodiment, the first zone Z1 of the nozzle 24C includes a piezoelectric actuator 302 on the inner tube ITB of the nozzle 24C, which applies vibration to the precursor material (such as liquid tin) to form a stream of the target material 25 (such as tin droplets). In some embodiments, the second zone Z2 of the nozzle 24C includes a tin filter 304 (or other precursor material filters) in the inner tube ITB of the nozzle 24C, which is used to filter out impurities and to purify the liquid tin (the precursor material) transferred from the reservoir 24B to the nozzle 24C. Furthermore, the third zone Z3 of the nozzle includes a connection tube 306 connecting the tin filter 304 to the reservoir 24B of the droplet generator 24. In other words, the connection tube 306 (may be part of the inner tube ITB) is located in between the reservoir 24B and the tin filter 304, and serve as a connection route therebetween.

In the illustrated embodiment, a plurality of heaters (H1, H2 and H3) are located on a peripheral surface of the nozzle 24C in the plurality of zones (Z1, Z2, Z3). In certain embodiments, the plurality of heaters (H1, H2 and H3) are located on a peripheral surface of the outer tube OTC of the nozzle 24C. For example, a first heater H1 is surrounding a peripheral surface of the nozzle 24C in the first zone Z1. A second heater H2 is surrounding a peripheral surface of the nozzle 24C in the second zone Z2. The third heater H3 is surrounding a peripheral surface of the nozzle 24C in the third zone Z3. In some embodiments, the first heater HE the second heater H2 and the third heater H3 are used to heat and maintain a temperature of the first zone Z1, the second zone Z2 and the third zone Z3 of the nozzle 24C. In certain embodiments, the first heater H1 is located at a center position of the first zone Z1, the second heater H1 is located at a center position of the second zone Z2, and the third heater H3 is located at a center position of the third zone Z3.

In some embodiments, the first heater HE the second heater H2 and the third heater H3 may be equally spaced apart from one another. For example, when a distance between the first heater H1 and the second heater H2 is DT1, and a distance between the second heater H2 and the third heater H3 is DT2, then the distance DT1 may be equal to the distance DT2. In one exemplary embodiment, when the nozzle 24C has a total length of 18 cm, then the lengths (L1, L2 and L3) of the first zone Z1, the second zone Z2 and the third zone Z3 may be respectively 6 cm. Furthermore, in such an embodiment, the first heater H1 may be spaced apart with the second heater H2 by 6 cm, while the second heater H2 may be spaced apart with the third heater H3 by 6 cm.

The plurality of heaters (H1, H2 and H3) are used to control a temperature of the nozzle 24C in each of the zones (Z1, Z2, Z3). In some embodiments, the heating of the first heater HE the second heater H2 and the third heater H3 are separately or independently controlled. For example, in some embodiments, a first electrical wiring EN1 is connected to the first heater H1 to control the heating of the first heater HE A second electrical wiring EN2 is connected to the second heater H2 to control the heating of the second heater H2. A third electrical wiring EN3 is connected to the third heater H3 to control the heating the third heater H3. Since the first electrical wiring EN1, the second electrical wiring EN2 and the third electrical wiring EN3 are separated and unconnected from one another, the heating of the first heater HE the second heater H2 and the third heater H3 are separately controlled. In other words, a temperature in the first zone Z1, a temperature in the second zone Z2, and a temperature in the third zone Z3 of the nozzle 24C may be separately controlled by opening, or closing down corresponding heaters (H1, H2 and H3), or adjusting an applied heat of these heaters (H1, H2 and H3).

In the exemplary embodiment, the first heater H1, the second heater H2 and the third heater are heating coils. For example, the first heater H1 includes a first heating coil with one coil turn, the second heater H2 includes a second heating coil with one coil turn, and the third heater H3 includes a third heating coil with one coil turn. Although the heating coils of the heaters (H1, H2 and H3) are illustrated to include only one coil turn that encircles the outer peripheral surface of the nozzle 24C in the different zones (Z1, Z2, Z3), it should be noted that the disclosure is not limited thereto. In alternative embodiments, heaters (H1, H2 and H3) having more than one coil turn may be employed. For example, the number of coil turns of the heating coil may be two, three, four, or more. In the exemplary embodiment, the number of coil turns in the heating coil of each of the heaters (H1, H2 and H3) is the same with one another. Furthermore, although heating coils are used in the embodiment as examples of the heaters (H1, H2 and H3), it should be noted that other type of heaters may be employed as long as the same heating function can be achieved. Additionally, the first heater H1, the second heater H2 and the third heater H3 may be the same type of heater (e.g. heating coils), or may be a combination of different type of heaters, which may be adjusted based on requirement.

Figure 5:
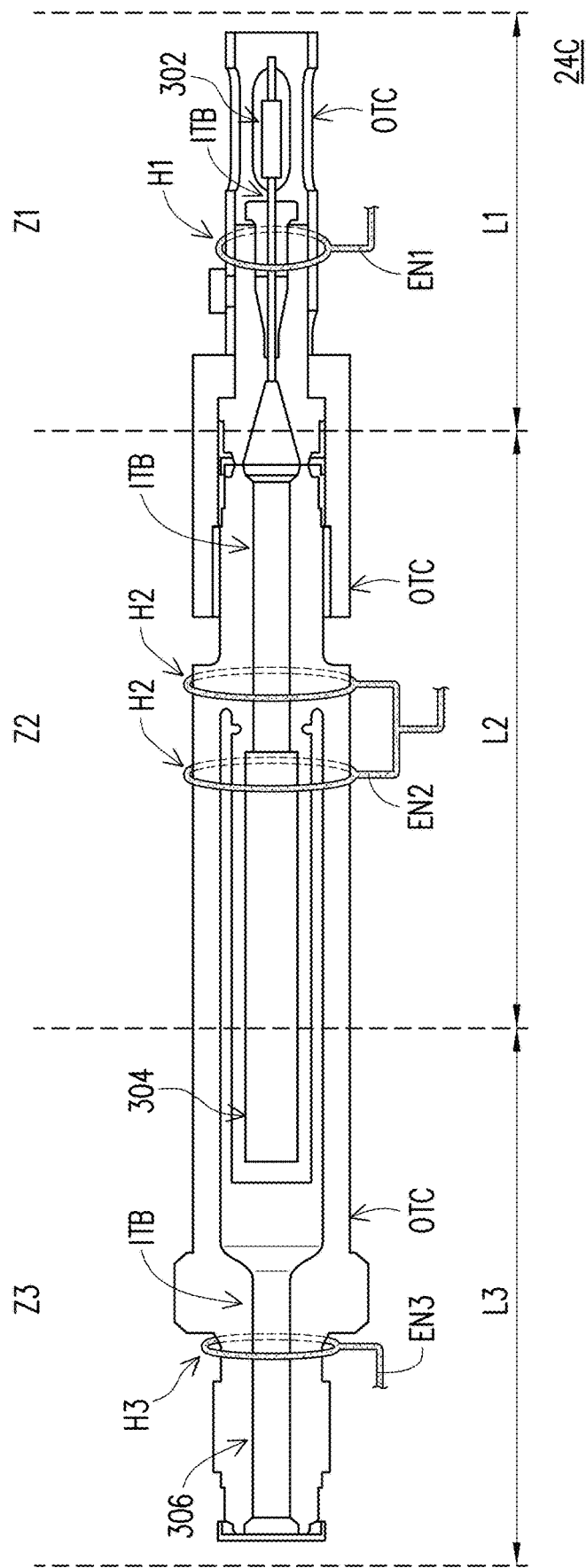
FIG. 5 illustrates a schematic diagram of a nozzle according to some other exemplary embodiments of the present disclosure.

FIG. 5 illustrates a schematic diagram of a nozzle according to some other exemplary embodiments of the present disclosure. The embodiment illustrated in FIG. 5 is similar to the embodiment illustrated in FIG. 4, hence the same reference numerals are used to refer to the same or liked parts, and its detailed description will be omitted herein. The difference between the embodiments is in the arrangement of the heaters (H1, H2, and H3). In the embodiment shown in FIG. 4, the heaters (H1, H2, and H3) respectively include a heating coil with one coil turn. In comparison, in the embodiment shown in FIG. 5, the first heater H1 and the third heater H3 includes heating coils with one coil turn, while the second heater H2 include a heating coil with two coil turns. By adjusting the number of coil turns in the second heater H2, the area of the different zones (Z1, Z2 and Z3) may be directly affected. For example, in the illustrated embodiment, a length L1 of the first zone Z1 is less than a length L2 of the second zone Z2, while a length L3 of the third zone Z3 is less than or equal to a length of the second zone Z2. Furthermore, in the exemplary embodiment, the two coil turns of the heating coil of the second heater H2 are connected together to the second electrical wiring EN2 so that the heating across the second zone Z2 may be kept approximately constant.

From the embodiments illustrated in FIG. 4 and FIG. 5, it can be noted that the number of coil turns in the heating coil of each of the heaters (H1, H2 and H3) is not particularly limited, and may be appropriately adjusted to control an area of the different zones (Z1, Z2 and Z3). For example, the number of coil turns in the heating coil in one of the heaters may be increased (as compared to the number of coil turns in the heating coil of the other heaters) to increase a length of a corresponding zone (Z1, Z2 and Z3) of the nozzle 24C. Furthermore, the number of coil turns in the heating coil in each of the heaters (H1, H2 and H3) may be the same or different. In addition, although a nozzle 24C having only three zones (Z1, Z2 and Z3) is illustrated, it should be noted that the disclosure is not limited thereto. In alternative embodiments, a nozzle 24C having two zones, four zones, or more than four zones may be employed. For example, the number of zones in the nozzle 24C may be adjusted by the placement of heaters spaced apart from one another in their respective zones, so that the heating of the different zones may be separately controlled.

Figure 6:
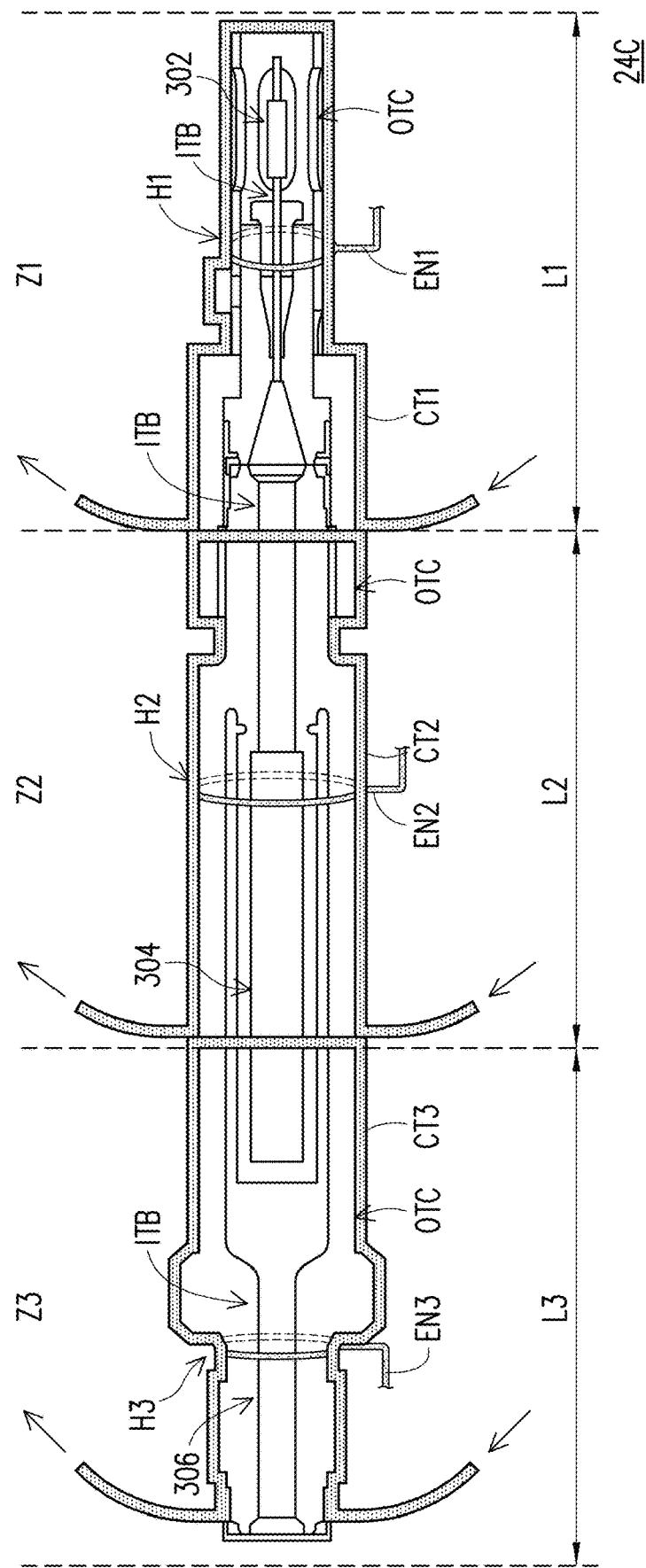
FIG. 6 illustrates a schematic diagram of a nozzle according to some other exemplary embodiments of the present disclosure.

FIG. 6 illustrates a schematic diagram of a nozzle according to some other exemplary embodiments of the present disclosure. The embodiment illustrated in FIG. 6 is similar to the embodiment illustrated in FIG. 4, hence the same reference numerals are used to refer to the same or liked parts, and its detailed description will be omitted herein. The difference between the embodiments is that a plurality of coolers (CT1, CT2 and CT3) is further provided on the nozzle 24C.

As illustrated in FIG. 6, in some embodiments, the nozzle 24C further includes a first cooler CT1 surrounding the peripheral surface of the nozzle 24C in the first zone Z1; a second cooler CT2 surrounding the peripheral surface of the nozzle 24C in the second zone Z2; and a third cooler CT3 surrounding the peripheral surface of the nozzle 24C in the third zone Z3. In some embodiments, the coolers (CT1, CT2 and CT3) are located on the peripheral surface of the outer tube OTC of the nozzle. In some embodiments, a position of the coolers (CT1, CT2 and CT3) may be overlapped with a position of the heaters (H1, H2, and H3). In alternative embodiments the position of the coolers (CT1, CT2 and CT3) may be non-overlapped with a position of the heaters (H1, H2, and H3). The position of the coolers (CT1, CT2 and CT3) may be appropriately adjusted as long as the cooling of the nozzle 24C in the different zones (Z1, Z2 and Z3) can be sufficiently achieved.

In the exemplary embodiment, the first cooler CT1, the second cooler CT2 and the third cooler CT3 are water cooling tubes. For example, in some embodiments, cooling water is supplied from one side (e.g. an inlet indicated by arrows) of the water cooling tube and passes through the peripheral surface of the nozzle 24C in the water cooling tube to cool down or control a temperature of the nozzle 24C, whereas the cooling water comes out from another side (e.g. an outlet indicated by arrows) of the water cooling tube. In the exemplary embodiment, the inlets and outlets of the water cooling tubes of the first cooler CT1, the second cooler CT2 and the third cooler CT3 are separated from one another (e.g. separate tubes). In other words, the cooling of the first cooler CT1, the second cooler CT2 and the third cooler CT3 are separately controlled. Although water cooling tubes are used as examples of the coolers (CT1, CT2 and CT3) in the embodiments, it is noted that the disclosure is not limited thereto. In alternative embodiments, other type of coolers may be employed as long as the same cooling function can be achieved.

FIG. 7A to FIG. 7D are schematic views of various stages of a nozzle in a method of generating a series of droplets using a droplet generator according to some exemplary embodiments of the present disclosure. The nozzle 24C illustrated in FIG. 7A to FIG. 7D is a simplified diagram of the nozzle 24C illustrated in FIG. 6. In other words, the same heaters (H1, H2 and H3), coolers (CT1, CT2 and CT3) and other components are present in the nozzle 24C of FIG. 7A to FIG. 7D but are omitted for ease of illustration. FIG. 8 is a flow chart of a method of generating a series of droplets using a droplet generator according to some exemplary embodiments of the present disclosure. The method illustrated in FIG. 7A to FIG. 7D will be described with reference to the flow chart shown in FIG. 8.

Figure 7A:
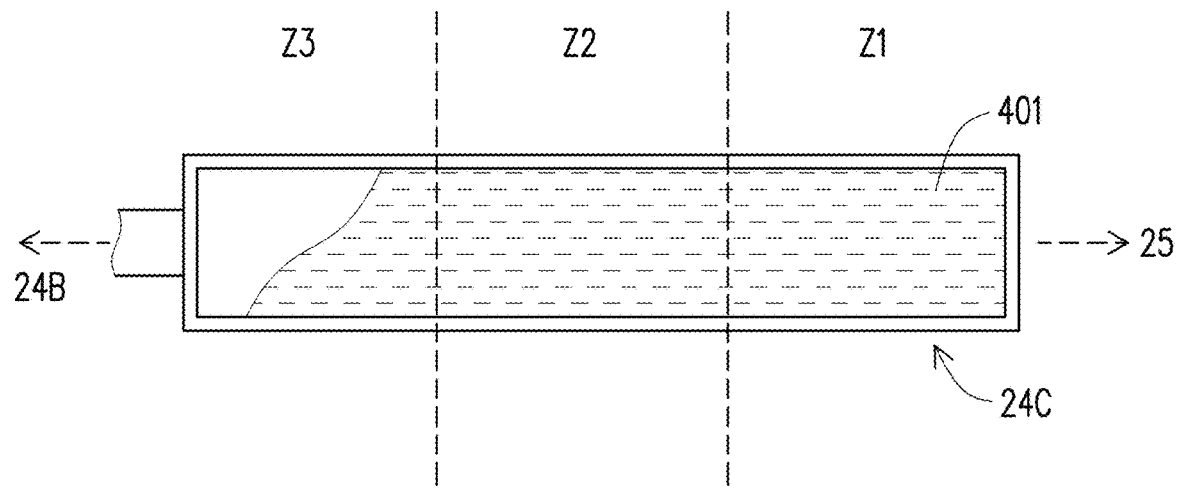
FIG. 7A to FIG. 7D are schematic views of various stages of a nozzle in a method of generating a series of droplets using a droplet generator according to some exemplary embodiments of the present disclosure.
Figure 8:
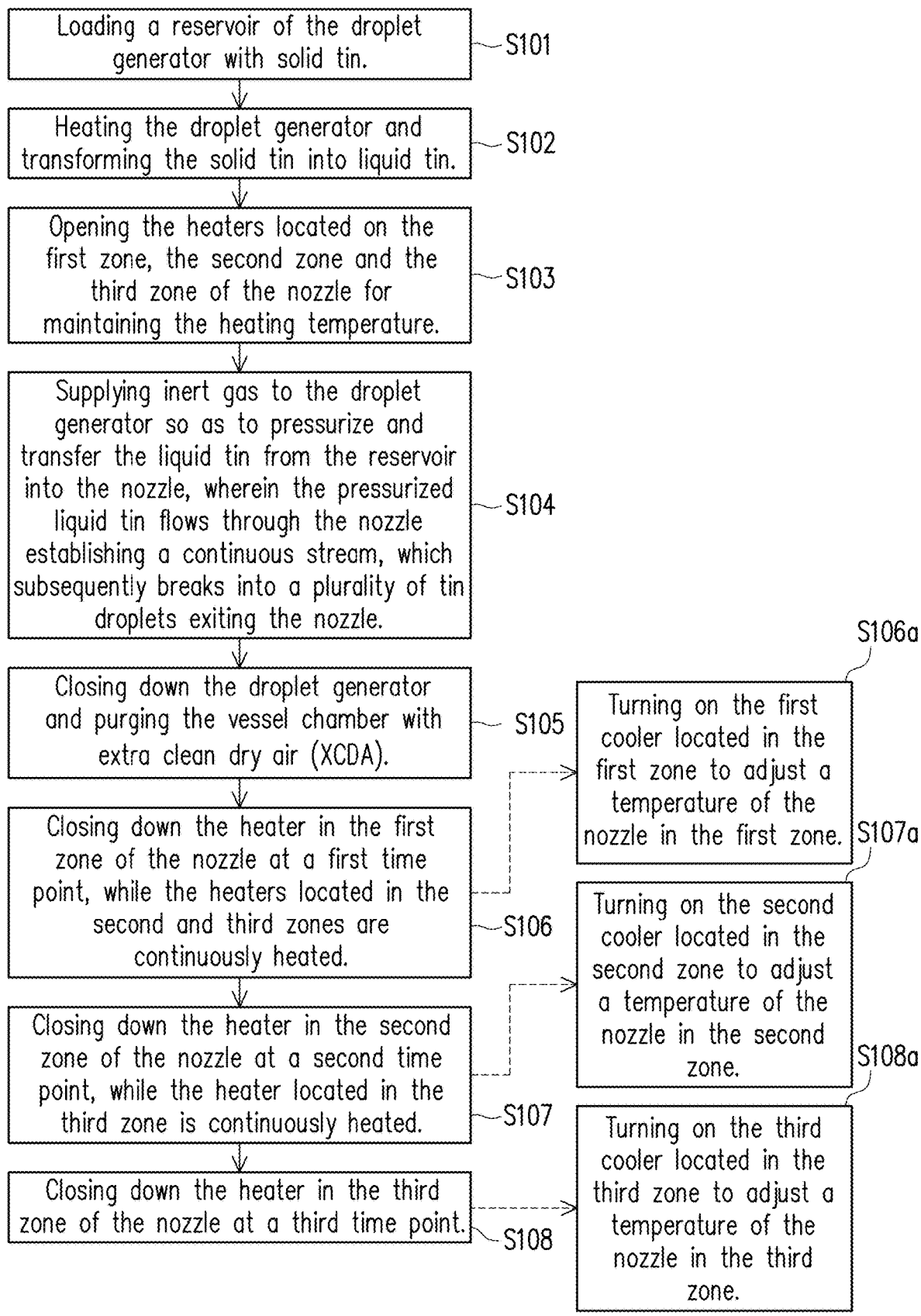
FIG. 8 is a flow chart of a method of generating a series of droplets using a droplet generator according to some exemplary embodiments of the present disclosure.

Referring to FIG. 7A, in a method of generating a series of tin droplets, a droplet generator 24 illustrated in FIG. 3 and the nozzle 24C illustrated in FIG. 6 is utilized. In some embodiments, referring to step S101 in FIG. 8, in a preparation step, the reservoir 24B of the droplet generator 24 may be loaded with a precursor material such as solid tin. Subsequently, referring to step S102 in FIG. 8, the droplet generator 24 may be heated so as to transform the solid tin into liquid tin 401. In some embodiments, the droplet generator 24 is heated from room temperature to 255° C. to transform the solid tin into liquid tin 401. In a similar way, referring to step S103 in FIG. 8, the heaters (H1, H2 and H3) on the first zone Z1, second zone Z2 and third zone Z3 of the nozzle 24C may be heated up for maintaining the heating temperature. Referring to step S104 in FIG. 8 and as illustrated in FIG. 7A, in an operation step, inert gas such as argon is supplied (e.g. at 4000 psi) from the gas supply unit 24D so as to pressurize and transfer the liquid tin 401 from the reservoir 24B into the nozzle 24C. For example, the liquid tin 401 fills up the first zone Z1, the second zone Z2 and the third zone Z3 of the nozzle 24C, whereas the pressurized liquid tin 401 flows through the nozzle 24C establishing a continuous stream, which subsequently breaks into a plurality of tin droplets (target material 25) exiting the nozzle 24C.

Figure 7B:
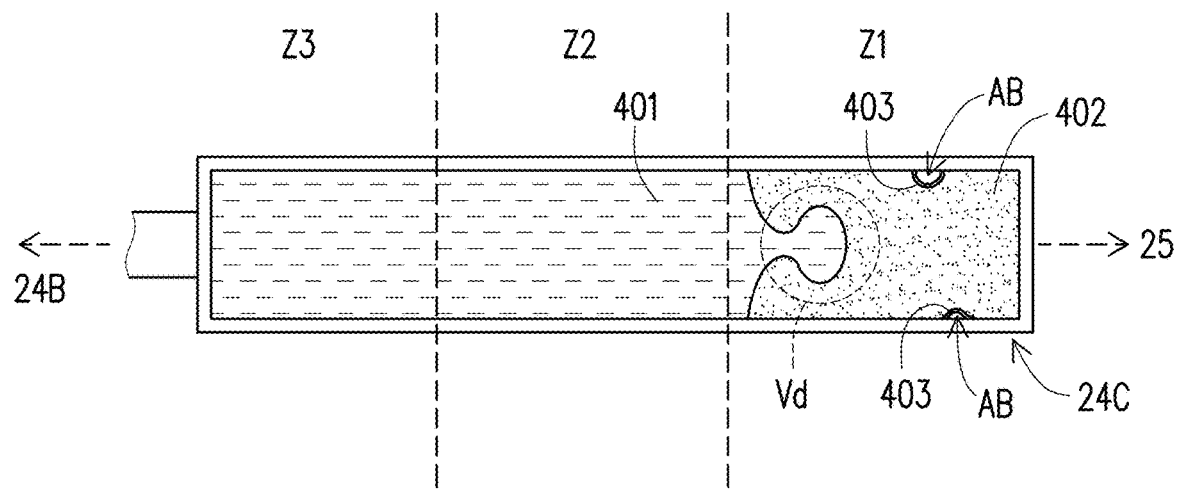
Figure 7C:
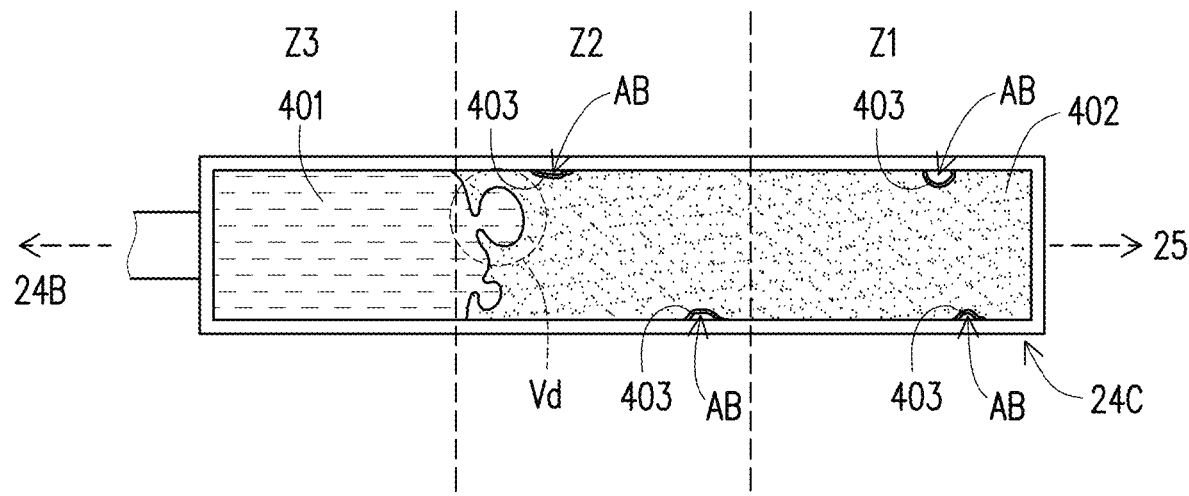
Figure 7D:
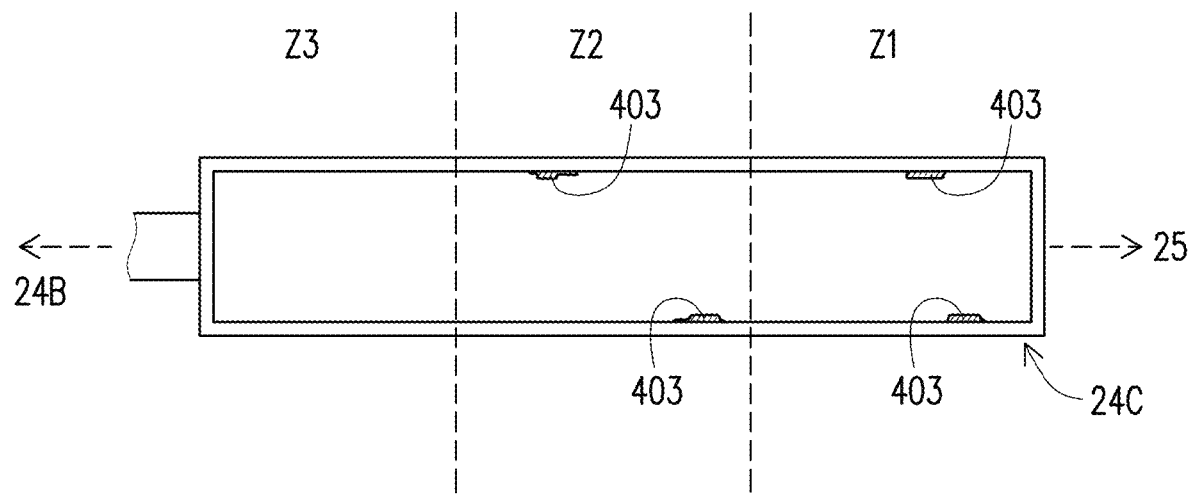

Referring to step S105 in FIG. 8 and as illustrated in FIG. 7B and FIG. 7C, upon completion of tin droplet generation, the droplet generator 24 may be closed down and vented for service. For example, the vessel chamber 110A may be purged with extra clean dry air (XCDA). During the service state, the nozzle 24C may be cooled by closing down the plurality of heaters H1 located in the first zone Z1 at a first time point, closing down the plurality of heaters H2 located in the second zone at a second time point later than the first time point, and closing down the plurality of heaters H3 located in the third zone Z3 at a third time point later than the second time point.

For example, referring to step S106 in FIG. 8 and as illustrated in FIG. 7B, the heater H1 located in the first zone Z1 is closed down at the first time point, while the heaters (H2 and H3) located in the other zones (Z2 and Z3) are continuously heated. In some embodiments, referring to step S106a in FIG. 8, after closing down the heaters H1 in the first zone Z1, the first cooler CT1 located in the first zone Z1 may be turned on to adjust a temperature of the nozzle 24C in the first zone Z1. As the first zone Z1 of the nozzle 24C is cooled down, the liquid tin 401 slowly changes state from liquid to solid to form solid tin 402. As the vessel chamber 110A is vented during the service state, the cooled liquid tin 401 may react with the oxygen source (XCDA) to form tin oxides 403 such as stannous oxide (SnO) and stannic oxide ($SnO_2$). In other words, air bubbles AB of tin oxide 403 may be generated as a side product during the cooling process.

Subsequently, referring to step S107 in FIG. 8 and as illustrated in FIG. 7C, the heaters H2 located in the second zone Z2 may then be closed down at the second time point. In some embodiments, referring to step S107a in FIG. 8, after closing down the heaters H2 in the second zone Z2, the second cooler CT2 located in the second zone Z2 may be turned on to adjust a temperature of the nozzle 24C in the second zone Z2. As the second zone Z2 of the nozzle 24C is cooled down, the liquid tin 401 in the second zone Z2 also changes state to form solid tin 402, and air bubbles AB of tin oxide 403 may be generated as a side product during the cooling process.

In a similar way, referring to step S108 in FIG. 8, after cooling down the second zone Z2, the heaters H3 located in the third zone Z3 may then be closed down at the third time point. In some embodiments, referring to step S108a in FIG. 8, after closing down the heaters H3 in the third zone Z3, the third cooler CT3 located in the third zone Z3 may be turned on to adjust a temperature of the nozzle 24C in the third zone Z3. As the third zone Z3 of the nozzle 24C is cooled down, the liquid tin 401 in the third zone Z3 also changes state to form solid tin 402, and air bubbles AB of tin oxide 403 may be generated as a side product during the cooling process. The cooling process may be completed after cooling down the third zone Z3 of the nozzle 24C. Referring to FIG. 6D, after the service state, the nozzle 24C may be ready for the next operation. For example, the same preparation and operation steps described above may be performed to generate tin droplets (target material 25), and EUV light may be generated through the EUV lithography device 100 as described in FIG. 1. However, it is noted that any tin oxide 403 formed in previous steps may remain on an inner surface of the nozzle 24C (e.g. inner surface of inner tube ITB).

In the embodiments of FIG. 7A to FIG. 7D, the first time point and the second time point are spaced apart by a time range of 30 minutes to 50 minutes, and the third time point and the second time point are spaced apart by a time range of 30 minutes to 50 minutes. In other words, the heaters (H1, H2 and H3) located in the different zones (Z1, Z2 and Z3) are closed down in sequence with at least 30 minutes time interval. In certain embodiments, the plurality of heaters (H1, H2 and H3) located in the first zone Z1, the second zone Z2 and the third zone Z3 are closed down in sequence in a way that a temperature difference between the first zone Z1 and the second zone Z2 is 30° C. to 50° C., and that a temperature difference between the second zone Z2 and the third zone Z3 is 30° C. to 50° C. In some embodiments, the plurality of coolers (CT1, CT2 and CT3) is turned on in sequence so that the first zone Z1, the second zone Z2 and the third zone Z3 of the nozzle 24C are cooled down at a rate of 0.5° C./minute to 2° C./minute. In certain embodiments, the first zone Z1, the second zone Z2 and the third zone Z3 of the nozzle 24C are cooled down at a rate of 1° C./minute.

By using the step-wise cooling process in the exemplary embodiment, the amount of tin oxide by-products formed in the nozzle 24C may be significantly reduced. For example, in some embodiments, when the first zone Z1 is cooled down to form solid tin 402 (shown in FIG. 7B), the liquid tin 401 from the second zone Z2 may flow over to the first zone Z1 and potentially fill up any voids Vd in the first zone Z1. Similarly, in some embodiments, when the second zone Z2 is cooled down to from solid tin 402 (shown in FIG. 7C), the liquid tin 401 from the third zone Z3 may flow over to the second zone Z2 and potentially fill up any voids Vd in the second zone Z2. As such, the formation of air bubbles of tin oxide 403 are reduced, and the amount of tin oxide deposits in the nozzle 24C may be reduced (shown in FIG. 7D). In comparison, in some embodiments, if the nozzle 24C is cooled down too quickly, tin oxidation reaction may be accelerated, which may result in a great amount of air bubble (of tin oxide (SnOx)) formation.

Figure 9:
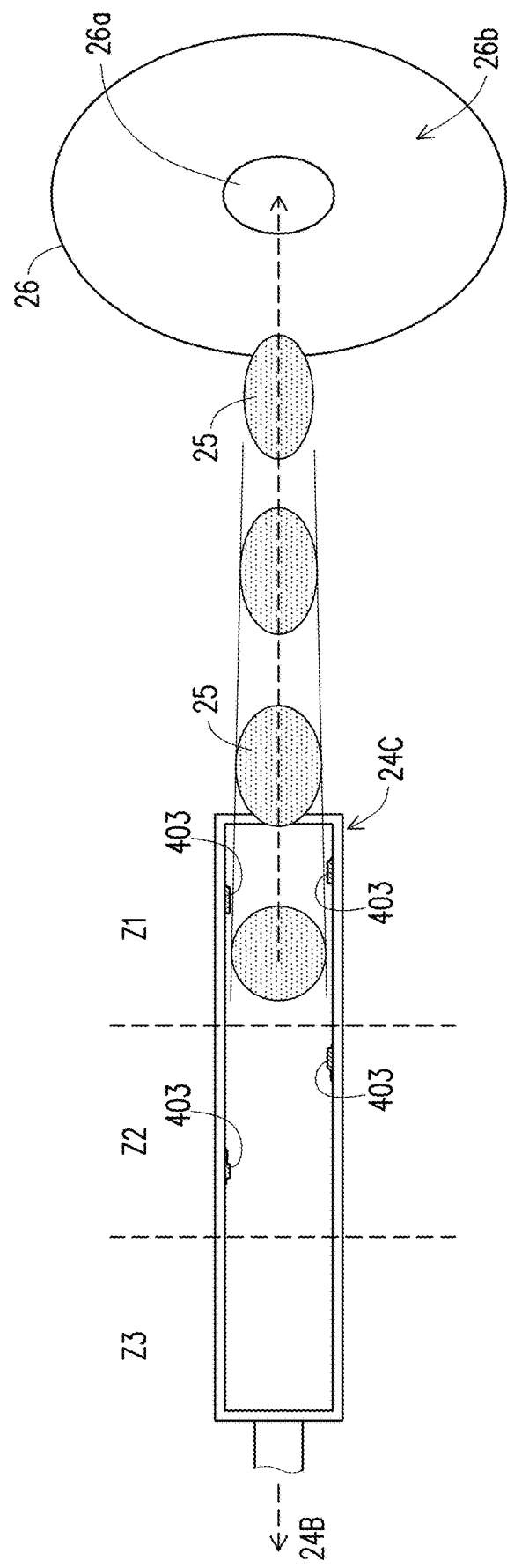
FIG. 9 is a schematic view of a nozzle and catcher tank in one stage of a method of generating a series of droplets using a droplet generator according to some exemplary embodiments of the present disclosure.

FIG. 9 is a schematic view of a nozzle and catcher tank in one stage of a method of generating a series of droplets using a droplet generator according to some exemplary embodiments of the present disclosure. Referring to FIG. 9, in the exemplary embodiment, during the operation step of the droplet generator 24 as described above, tin droplets (target material 25) are generated by the droplet generator 24 exiting the nozzle 24C, and are further collected by an opening 26a of the catcher tank 26. Since the amount of tin oxide deposits (403) in the nozzle 24C is reduced through the step-wise cooling process, the trajectory of the droplets (target material 25) exiting the nozzle 24C may be correctly aligned with the catcher tank 26. In other words, the droplets (target material 25) may be accurately collected by the catcher tank 26, and droplet backsplash may be prevented.

Figure 10A:
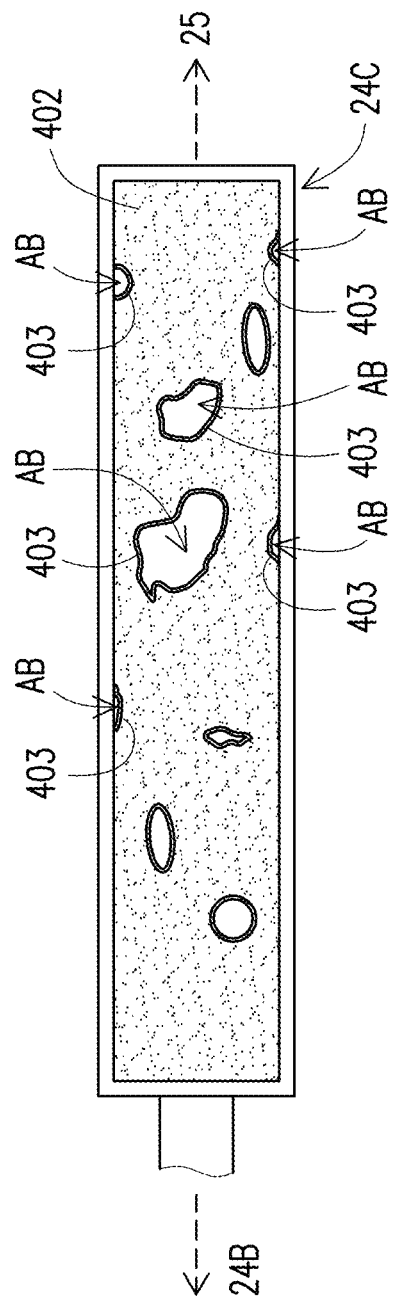
FIG. 10 A and FIG. 10B are schematic views of a nozzle and catcher tank in various stages of a method of generating a series of droplets using a droplet generator according to some comparative embodiments of the present disclosure.
Figure 10B:
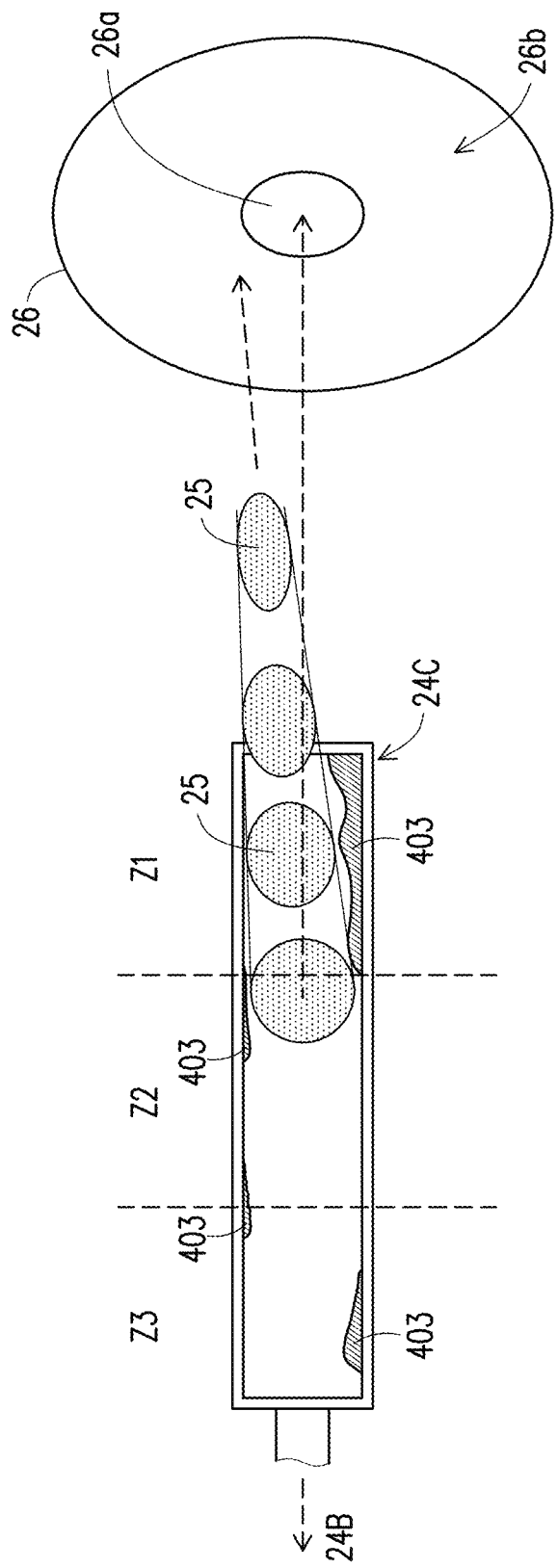

FIG. 10 A and FIG. 10B are schematic views of a nozzle and catcher tank in various stages of a method of generating a series of droplets using a droplet generator according to some comparative embodiments of the present disclosure. Referring to FIG. 10A, in some comparative embodiments, during the service state of the droplet generator 24, no heaters and coolers are used to control a temperature of the nozzle 24C. As such, when the nozzle 24C is rapidly cooled down to room temperature, a large amount of air bubbles AB of tin oxide 403 may be generated as a side product during the cooling process. For example, referring to FIG. 10B, a large amount of tin oxide 403 formed in the previous step may remain on an inner surface of the nozzle 24C.

Subsequently, during an operation step illustrated in FIG. 10B, tin droplets (target material 25) are generated by the droplet generator 24 exiting the nozzle 24C, and are further collected by the catcher tank 26. In the comparative embodiment, since the amount of tin oxide deposits (403) in the nozzle 24C is large, there is a risk of trajectory deviation of the ejected tin droplets (target material 25) exiting the nozzle 24C. In other words, it is possible that the generated tin droplets (target material 25) may hit outside the catcher tank 26. As such, there would be a significant amount of tin wool or tin contamination that remain around the catcher tank surface 26b, and the risk of droplet backsplash or collector reflectivity drop will be increased.

In the above-mentioned embodiments, since the EUV lithography device includes a plurality of heaters located on the peripheral surface of the nozzle in different zones, the temperature of the nozzle in different zones may be appropriately controlled during the cooling down process. As such, a step-wise cooling process may be applied, and the generation of tin oxide deposits may be reduced. By reducing the amount of tin oxide deposits in the nozzle, the risk of trajectory deviation of the ejected tin droplets is minimized. Overall, tin wool or tin contamination around the catcher tank surface can be reduced, and the risk of droplet backsplash or collector reflectivity drop may be decreased. In addition, the lifetime time of the droplet generator and collector (catcher tank) may be extended.

In accordance with some embodiments of the present disclosure, a droplet generator including a steering system, a reservoir, a nozzle, a first heater, a second heater and a third heater is provided. The steering system is used for controlling a position of droplet release of the droplet generator. The reservoir is held on the steering system for storing tin. The nozzle is connected with the reservoir for generating tin droplets, wherein the nozzle comprises at least a first zone, a second zone and a third zone connected in sequence. The first heater surrounds a peripheral surface of the nozzle in the first zone. The second heater surrounds a peripheral surface of the nozzle in the second zone. The third heater surrounds a peripheral surface of the nozzle in the third zone, wherein the heating of the first heater, the second heater and the third heater are separately controlled.

In accordance with some other embodiments of the present disclosure, an extreme ultraviolet (EUV) lithography device including a radiation source, an illuminator and a projection module is provided. The radiation source includes a droplet generator, a plurality of heaters, a plurality of coolers, a vessel chamber and a catcher tank. The droplet generator includes a nozzle for generating tin droplets, wherein the nozzle is separated into a plurality of zones connected in sequence. The plurality of heaters is located on a peripheral surface of the nozzle in the plurality of zones. The plurality of coolers is located on a peripheral surface of the nozzle in the plurality of zones. The vessel chamber is where the tin droplets are processed into plasma, and further produces radiation light. The catcher tank is used for collecting the tin droplets. The illuminator is used for directing the radiation light to a reticle stage. The projection module is used for projecting the radiation light from the reticle stage onto a wafer stage.

In accordance with yet another embodiment of the present disclosure, a method of generating a series of droplets using a droplet generator including a nozzle having at least a first zone, a second zone and a third zone connected in sequence, and a plurality of heaters respectively located on a peripheral surface of the nozzle in the first zone, the second zone and the third zone is described. The method includes the following steps. A reservoir of the droplet generator is loaded with solid tin. The droplet generator and the nozzle with the plurality of heaters are heated to transform the solid tin into liquid tin, and the liquid tin is transferred from the reservoir to the nozzle under supplied pressure to form tin droplets. The nozzle is cooled down by closing down the plurality of heaters located in the first zone at a first time point, closing down the plurality of heaters located in the second zone at a second time point later than the first time point, and closing down the plurality of heaters located in the third zone at a third time point later than the second time point.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A droplet generator, comprising:
a steering system for controlling a position of droplet release of the droplet generator;
a reservoir held on the steering system for storing tin;
a nozzle connected with the reservoir for generating tin droplets, wherein the nozzle comprises at least a first zone, a second zone and a third zone connected in sequence;
a first heater surrounding a peripheral surface of the nozzle in the first zone;
a second heater surrounding a peripheral surface of the nozzle in the second zone; and
a third heater surrounding a peripheral surface of the nozzle in the third zone, wherein the heating of the first heater, the second heater and the third heater are separately controlled.

2. The droplet generator according to claim 1, wherein the first heater, the second heater and the third heater are heating coils.

3. The droplet generator according to claim 1, wherein the first zone of the nozzle includes a piezoelectric actuator, the second zone of the nozzle includes a tin filter, and the third zone of the nozzle includes a connection tube connected to the reservoir.

4. The droplet generator according to claim 1, wherein a ratio of a length of the first zone, a length of the second zone and a length of the third zone is 1:1:1.

5. The droplet generator according to claim 1, further comprising a first cooler surrounding the peripheral surface of the nozzle in the first zone, a second cooler surrounding the peripheral surface of the nozzle in the second zone, and a third cooler surrounding the peripheral surface of the nozzle in the third zone, wherein the cooling of the first cooler, the second cooler and the third cooler are separately controlled.

6. The droplet generator according to claim 5, wherein the first cooler, the second cooler and the third cooler are water cooling tubes.

7. An extreme ultraviolet (EUV) lithography device, comprising:
a radiation source, which comprises:
a droplet generator comprising a nozzle for generating tin droplets, wherein the nozzle is separated into a plurality of zones connected in sequence;
a plurality of heaters respectively located on a peripheral surface of the nozzle in the plurality of zones, wherein the plurality of heaters includes a first heating coil surrounding the peripheral surface of the nozzle in a first zone of the plurality of zones, a second heating coil surrounding the peripheral surface of the nozzle in a second zone of the plurality of zones, and a third heating coil surrounding the peripheral surface of the nozzle in a third zone of the plurality of zones, and the first heating coil, the second heating coil and the third heating coil are separated from one another;
a plurality of coolers respectively located on the peripheral surface of the nozzle in the plurality of zones;
a vessel chamber where the tin droplets are processed into plasma, and further produces radiation light;
a catcher tank for collecting the tin droplets;
an illuminator for directing the radiation light to a reticle stage; and
a projection module for projecting the radiation light from the reticle stage onto a wafer stage.

8. The EUV lithography device according to claim 7, wherein the plurality of heaters further comprises a first electrical wiring connected to the first heating coil, a second electrical wiring connected to the second heating coil, and a third electrical wiring connected to the third heating coil, wherein the first electrical wiring, the second electrical wiring and the third electrical wiring are separated and unconnected from one another so that the heating of the first heating coil, the second heating coil and the third heating coil can be separately controlled.

9. The EUV lithography device according to claim 7, wherein a ratio of a length of the first zone, a length of the second zone and a length of the third zone is 1:1:1.

10. The EUV lithography device according to claim 7, wherein a length of the first zone is less than a length of the second zone, and a length of the third zone is equal to or less than a length of the second zone.

11. The EUV lithography device according to claim 7, wherein the first zone of the nozzle includes a piezoelectric actuator, the second zone of the nozzle includes a tin filter, and the third zone of the nozzle includes a connection tube connecting the tin filter to a reservoir of the droplet generator.

12. The EUV lithography device according to claim 7, wherein the plurality of coolers comprises water cooling tubes.

13. The EUV lithography device according to claim 12, wherein the water cooling tubes includes a first cooling tube surrounding the peripheral surface of the nozzle in a first zone of the plurality of zones, a second cooling tube surrounding the peripheral surface of the nozzle in a second zone of the plurality of zones, and a third cooling tube surrounding the peripheral surface of the nozzle in a third zone of the plurality of zones, wherein the first cooling tube, the second cooling tube and the third cooling tube are separated and unconnected from one another so that the cooling of the first cooling tube, the second cooling tube and the third cooling tube can be separately controlled.

14. The EUV lithography device according to claim 7, wherein the droplet generator further comprises a reservoir for storing tin, the reservoir is connected to the nozzle, and wherein the plurality of heaters and the plurality of coolers are physically separated from the reservoir.

15. A method of generating a series of droplets using a droplet generator comprising a reservoir, a nozzle connected to the reservoir and having at least a first zone, a second zone and a third zone connected in sequence, and a plurality of heaters respectively located on a peripheral surface of the nozzle in the first zone, the second zone and the third zone, wherein the method comprises:
loading the reservoir of the droplet generator with solid tin;

heating the reservoir to transform the solid tin into liquid tin;

heating the nozzle using the plurality of heaters, and transferring the liquid tin from the reservoir to the nozzle under supplied pressure to form tin droplets; and cooling down the nozzle by closing down the plurality of heaters located in the first zone at a first time point, closing down the plurality of heaters located in the second zone at a second time point later than the first time point, and closing down the plurality of heaters located in the third zone at a third time point later than the second time point.

16. The method according to claim 15, wherein the first time point and the second time point are spaced apart by a time range of 30 minutes to 50 minutes, and the third time point and the second time point are spaced apart by a time range of 30 minutes to 50 minutes.

17. The method according to claim 15, wherein the plurality of heaters located in the first zone, the second zone and the third zone are closed down in sequence in a way that a temperature difference between the first zone and the second zone is 30° C. to 50° C., and that a temperature difference between the second zone and the third zone is 30° C. to 50° C.

18. The method according to claim 15, wherein an oxygen source is supplied to the droplet generator when cooling down the nozzle.

19. The method according to claim 15, wherein the droplet generator is further equipped with a plurality of coolers respectively located on the peripheral surface of the nozzle in the first zone, the second zone and the third zone, and the method further comprises:

turning on the plurality of coolers located in the first zone after the first time point prior to the second time point;

turning on the plurality of coolers located in the second zone after the second time point prior to the third time point; and turning on the plurality of coolers located in the third zone after the third time point.

20. The method according to claim 19, wherein the plurality of coolers is turned on in sequence so that the first zone, the second zone and the third zone of the nozzle are cooled down at a rate of 0.5° C./minute to 2° C./minute.

* * * * *